(12) United States Patent
Fry et al.

(10) Patent No.: US 10,060,974 B2
(45) Date of Patent: Aug. 28, 2018

(54) ELECTRICAL CIRCUIT ODOMETER SENSOR ARRAY

(71) Applicant: INTERNATIONAL BUSINESS MACHINES CORPORATION, Armonk, NY (US)

(72) Inventors: Jonathan R. Fry, Wappingers Falls, NY (US); Christopher Klabes, Poughkeepsie, NY (US); Andrew J. Martin, Carmel, NY (US); Vincent J. McGahay, Poughkeepsie, NY (US); Kathryn E. Schlichting, Pleasant Valley, NY (US); Melissa A. Smith, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 413 days.

(21) Appl. No.: 14/574,746

(22) Filed: Dec. 18, 2014

(65) Prior Publication Data

US 2016/0178694 A1    Jun. 23, 2016

(51) Int. Cl.
*G01R 31/26* (2014.01)
*G01R 31/28* (2006.01)
*G01C 22/00* (2006.01)

(52) U.S. Cl.
CPC ......... *G01R 31/2896* (2013.01); *G01C 22/00* (2013.01)

(58) Field of Classification Search
CPC ............ G01R 31/2851; G01R 31/2853; G01R 31/2855; G01R 31/2856; G01R 31/2858; G01R 31/2884; G01R 31/2896; G01R 31/3008; G01R 31/3012; G01R 31/318513; G01R 31/3187; G01R 31/318563; G01C 22/00
USPC ...... 257/48; 324/537, 750.3, 762.01, 762.02, 324/762.03, 762, 762.06; 438/14, 17, 18
See application file for complete search history.

(56) References Cited

U.S. PATENT DOCUMENTS

| | | | |
|---|---|---|---|
| 6,118,137 A | * | 9/2000 | Fulford, Jr. ............. H01L 22/34 257/48 |
| 6,724,214 B2 | | 4/2004 | Manna et al. |
| 6,864,701 B2 | * | 3/2005 | Yao ......................... H01L 22/34 324/762.01 |

(Continued)

FOREIGN PATENT DOCUMENTS

| JP | 5301478 | 9/2013 |
|---|---|---|
| WO | 2013144340 | 10/2013 |

OTHER PUBLICATIONS

Keane et al., "On-Chip Silicon Odometers and their Potential Use in Medical Electronics", IEEE International Reliability Physics Symposium, 2012, 8 pages.

(Continued)

*Primary Examiner* — Jermele M Hollington
*Assistant Examiner* — Steven Yeninas
(74) *Attorney, Agent, or Firm* — Anthony Canale; Andrew M. Calderon; Roberts Mlotkowski Safran Cole & Calderon, P.C.

(57) ABSTRACT

Approaches for detecting wear in integrated circuit chips are provided. An on-chip sensor system includes an integrated circuit chip including a plurality of sensor groups. Each respective one of the sensor groups is structured and arranged to detect a measure of wear corresponding to a respective one of a plurality of failure mechanisms.

20 Claims, 8 Drawing Sheets

(56) References Cited

U.S. PATENT DOCUMENTS

| | | | |
|---|---|---|---|
| 7,005,871 B1 | 2/2006 | Davies et al. | |
| 7,017,092 B2 | 3/2006 | Hsieh | |
| 7,205,854 B2 | 4/2007 | Liu | |
| 7,271,608 B1 | 9/2007 | Vermeire et al. | |
| 7,437,580 B2 | 10/2008 | Henderson et al. | |
| 7,576,569 B2 | 8/2009 | Carpenter et al. | |
| 2003/0020503 A1* | 1/2003 | Weiland | G01R 1/073 324/762.01 |
| 2004/0207383 A1* | 10/2004 | Wang | G01R 31/2831 324/71.2 |
| 2006/0049886 A1 | 3/2006 | Agostinelli, Jr. et al. | |
| 2007/0164768 A1 | 7/2007 | Hsu et al. | |
| 2007/0252611 A1* | 11/2007 | Kerber | G01R 31/2884 324/750.3 |
| 2008/0184805 A1* | 8/2008 | Cheng | G01R 31/2858 73/788 |
| 2009/0132985 A1* | 5/2009 | Hsu | G06F 17/5036 716/122 |
| 2009/0152595 A1* | 6/2009 | Kaga | G01R 31/2884 257/208 |
| 2012/0249170 A1 | 10/2012 | Baumann et al. | |
| 2013/0038334 A1* | 2/2013 | Brochu, Jr. | G01R 31/2858 324/537 |
| 2013/0285685 A1 | 10/2013 | Bowman et al. | |
| 2014/0197895 A1 | 7/2014 | Chen et al. | |
| 2015/0338454 A1* | 11/2015 | Jenkins | G01R 31/2856 324/750.01 |

OTHER PUBLICATIONS

Wooters et al.,"Tracking On-Chip Age Using Distributed, Embedded Sensors", IEEE Transactions on Very Large Scale Integration Systems, vol. 20, Issue: 11, 2011, 12 pages.

Keane et al., "An Array-Based Odometer System for Statistically Significant Circuit Aging Characterization", IEEE Journal of Solid-State Circuits, vol. 46, Issue: 10, 2011, 12 pages.

Keane et al., "An All-In-One Silicon Odometer for Separately Monitoring HCI, BTI, and TDDB", IEEE Journal of Solid-State Circuits, vol. 45. Issue: 4, 2010, 13 pages.

Schlunder et al., "A new smart device array structure for statistical investigations of BTI degradation and recovery", IEEE International Reliability Physics Symposium, 2011, 5 pages.

Disclosed Anonymously, "An On-chip MOSFET Breakdown Process Prognostics Circuit and Reliability Sensor," IP.com No. IPCOM000223290D, Nov. 15, 2012, 6 pages.

IBM, "Timing Critical Path Based Digital Chip Aging Measurement," IP.com No. IPCOM000183721D, Jun. 1, 2009, 6 pages.

Hyunbean Yi, "An on-chip test clock control scheme for circuit aging monitoring," Journal of Semiconductor Technology and Science 13.1, Feb. 1, 2013, pp. 71-78.

Kim et al. "Silicon Odometer: An On-chip Reliability Monitor for Measuring Frequency Degradation of Digital Circuits," IEEE Journal of Solid-State Circuits, vol. 43, Issue: 4, 2008, pp. 874-880.

* cited by examiner

ELECTRICAL CIRCUIT ODOMETER SENSOR ARRAY

FIELD OF THE INVENTION

The invention relates to integrated circuits and, more particularly, to systems and methods for detecting and determining wear that occurs in integrated circuit chips.

BACKGROUND

It is difficult to gauge the apparent "wear and tear" or "health" of a semiconductor component as a function of time other than through statistical models generated by accelerated aging and/or stress studies. Failure analysis on packaged silicon is difficult and does not provide a way to target faults aside from memory array fails. Moreover, there are not many in-situ sensors available for root cause failure analysis.

Accelerated aging studies simulate and predict failure using numerical (statistical) methods, but do not simulate very well real world usage and do not identify a specific cause of failure or wear-down of a particular integrated circuit chip. Individual modules of an actual chip can be exposed to different environments which can contribute to unequal breakdown of the material, and this variability cannot be accurately predicted using statistical methods.

On-chip thermal sensors and ring oscillators provide data that may be used to perform regression analysis of breakdown and/or wear of chip material based on statistical models. However, these devices provide only very coarse spatial locality, or none at all.

SUMMARY

In a first aspect of the invention, there is an on-chip sensor system that includes an integrated circuit chip including a plurality of sensor groups. Each respective one of the sensor groups is structured and arranged to detect a measure of wear corresponding to a respective one of a plurality of failure mechanisms.

In another aspect of the invention, there is a semiconductor device that includes a plurality of graduated sensor structures that are configured to fail sequentially at different levels of exposure to a particular failure mechanism. The sensor structures are formed in a die portion of an integrated circuit chip.

In another aspect of the invention, there is a method of determining an amount of wear on a semiconductor device. The method includes detecting failure of a particular sensor structure comprised in a group of graduated sensor structures that are structured and arranged to fail sequentially due to exposure to a first failure mechanism, wherein the sensor structures are formed in the semiconductor device. The method also includes correlating the failure of the particular sensor structure to an amount of wear experienced by the semiconductor device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
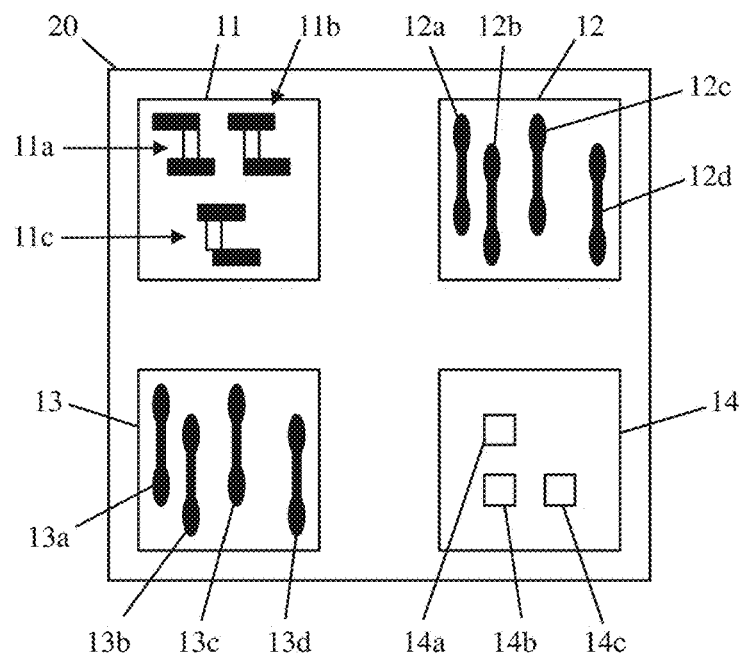
FIG. 1 shows an array of groups of sensor structures in accordance with aspects of the invention.

The invention relates to integrated circuits and, more particularly, to systems and methods for detecting and determining wear that occurs in integrated circuit chips. According to aspects of the invention, there is an on-die (on-chip) sensor system for determining chip health. In embodiments, the sensor system includes a plurality of sensor groups, each respective sensor group being structured and arranged to detect a particular type of failure mechanism (e.g., metal migration, dielectric breakdown, thermal-mechanical stress, transistor failure, etc.). Within each group there are plural sensor structures that provide a graduated measure of wear and/or failure due to the failure mechanism associated with the particular sensor group. Aspects of the invention thus provide for determining actual chip wear and/or failure due to a particular failure mechanism by identifying which of the sensor groups indicates a failure (partial or full). Aspects of the invention further provide for determining a degree of occurrence of (or exposure to) the particular failure mechanism by identifying which sensor structure failed within the sensor group associated with the particular failure mechanism.

The devices of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

In embodiments, one or more of the sensor structures may include passive elements that are not powered during operation of the chip. Such passive elements are useful for measuring the effects of thermal and/or mechanical stress, for example. One or more of the sensor structures may include alternatively active elements that are powered during operation of the chip. Such active elements may be subjected to the same current that is applied to functional (non-sensor) devices of the chip, and thus may be useful for determining metal migration failure mechanisms such as electromigration (EM) induced voids, EM induced shorts, and shorts due to dielectric breakdown. The active elements may alternatively be utilized as stress-test sensors by subjecting them to elevated power relative to the functional devices of the chip (e.g., higher current, faster cycle times, etc.).

According to additional aspects of the invention, an on-chip monitor is operatively connected to one or more of the sensor groups. In embodiments, the monitor receives and interprets signals from the sensor groups to determine one or more of apparent age, wear, and potential near failure of the die. Based on the signals from the sensor groups, the monitor may control the chip to operate in an adjusted state, e.g., at different (e.g., lower) clocking speed, different (e.g., lower) power, etc. Additionally or alternatively, the monitor may send a communication to an off-chip device where the communication provides, for example, an indication of the health of the chip that is determined based on the signals from the sensor groups.

Implementations of the invention thus include sensor structures that physically gauge the aging, wear, and/or failure modes of a chip during actual chip operation, as opposed to interpolation and/or projection from electrical measurements. In this manner, aspects of the invention provide the following advantages: greater field reliability with real world data; better customer experience with minimal downtime; faster and more accurate engineering analysis and characterization; and information on variation in semiconductor processes as it relates to individual die.

As described herein, embodiments may include an on-chip monitoring core to gauge the amount of wear during the life of the chip. Implementations of the invention can thus be used to determine the amount of wear that a chip experienced when the chip is returned for failure analysis. This provides a particular advantage of improving the diagnosability of original equipment manufacturer (OEM) fails (e.g., for events such as over voltage, over current, etc.) to better understand why a failure occurred. For example, when a part containing the chip is returned due to failure, the reason for the failure may have been misuse of the part (e.g., by an outside system integrator), as opposed to any defect in the part itself. In other words, a failure in the device might not have been caused by a failure in the chip's design or manufacture, but rather because it was being used improperly such that an unusual amount of stress was put on the chip. For example, aspects of the invention allow the part manufacturer be able to detect the apparent age of the part as compared to its chronological age, which is useful in determining the root cause of a failure.

FIG. 1 shows exemplary sensor groups 11-14 in accordance with aspects of the invention. Each respective sensor group 11-14 includes plural on-chip sensor structures that are structured and arranged to detect a degree of a particular type of failure mechanism (i.e., breakdown mode) in an integrated circuit chip. In embodiments, the sensor structures in each respective sensor group include a series of structures that are built, based on design constraints, with expected fail signatures that correspond to an apparent age of the chip. For example, the sensor structures may be graduated relative to one another (e.g., in one or more of size, shape/geometry, spacing, etc.) such that they are designed to fail or degrade in a sequential manner that is observable and closely correlated to wear that occurs in the chip due to an actual operational environment.

Figure 3:
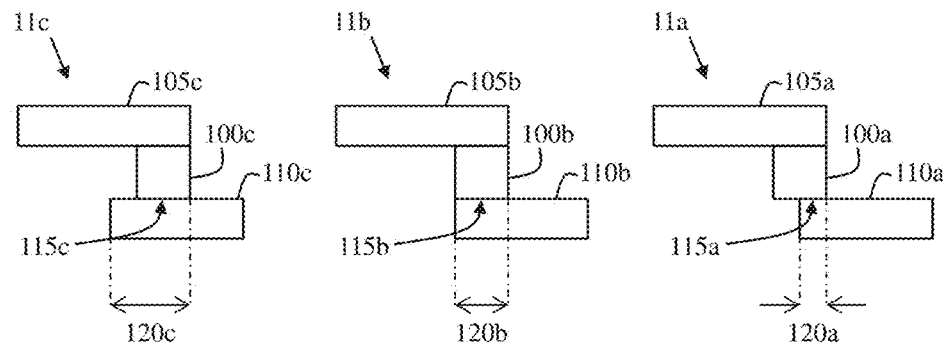
FIGS. 3-5 show an implementation of a sensor structure in accordance with aspects of the invention.
Figure 4:
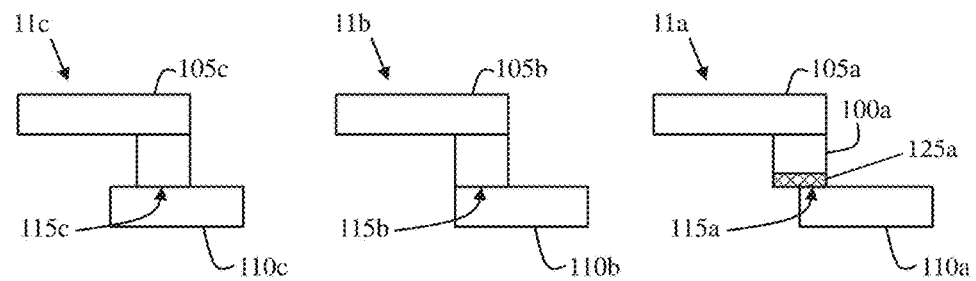
Figure 5:
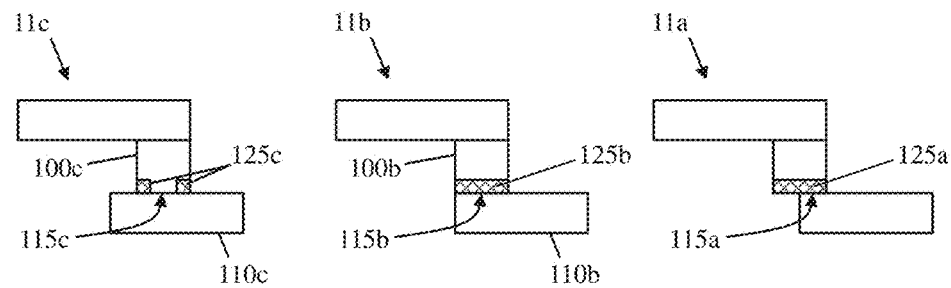

In the example, depicted in FIG. 1, sensor group 11 includes sensor structures 11a-c that are collectively arranged as a thermo-mechanical stress sensor that detects a degree of stress induced voids at a material-to-material interface, as described in greater detail herein with respect to FIGS. 3-5. Sensor group 12 includes sensor structures 12a-d that are collectively arranged as a thermo-mechanical stress and electromigration (EM) sensor that detects a degree of stress induced shorts due to metal migration between adjacent wires and vias, as described in greater detail herein with respect to FIGS. 6A-8B. Sensor group 13 includes sensor structures 13a-d that are collectively arranged as a thermo-mechanical stress and electromigration (EM) sensor that detects a degree of dielectric material breakdown between adjacent wires and vias, as described in greater detail herein with respect to FIGS. 9A-10B. Sensor group 14 includes sensor structures 14a-c that are collectively arranged as a transistor failure sensor that detects accelerated aging of a transistor due to, for example, bias temperature instability (BTI), hot carrier injection, etc., as described in greater detail herein with respect to FIG. 11.

The sensor groups 11-14 and respective sensor structures 11a-c, 12a-d, 13a-d, 14a-c shown in FIG. 1 are merely exemplary and are not intended to limit the scope of the invention. For example, although four sensor groups 11-14 are shown, any desired number of sensor groups are contemplated for use in implementations of the invention. Moreover, each sensor group may have any desired number of sensor structures. Further, the sensor groups and sensor structures may be configured to detect failure mechanisms (breakdown modes) other than those described herein.

Figure 2:
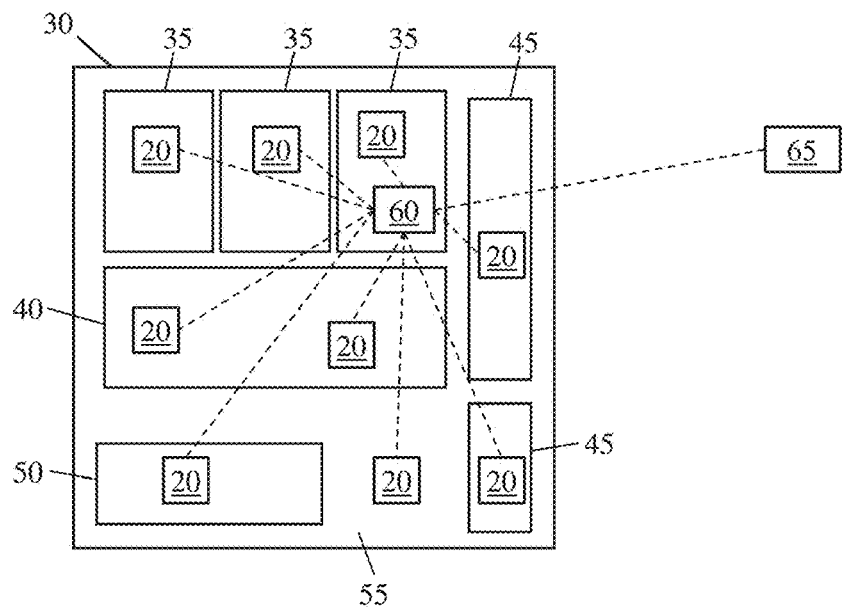
FIG. 2 shows plural arrays on a chip in accordance with aspects of the invention.

As depicted in FIG. 1, the sensor groups 11-14 may be arranged in an array 20. In an exemplary embodiment, an array can be a systematic arrangement of objects, usually in rows and/or columns. As shown in FIG. 2, plural instances of the array 20 may be located at different locations on an integrated circuit chip 30. For example, instances of the array 20 may be located in one or more blocks including, but not limited to: one or more processor cores 35, cache 40, I/O blocks 45, power regions 50, and nest 55 (e.g., interconnecting logic and wiring between blocks on the chip 30). In this manner, implementations of the invention provide for determining apparent age (e.g., wear) and/or failure at plural different regions of the chip 30 and based on an actual operation of the chip (rather than statistical predictive models). The chip 30 may be any suitable semiconductor device, and may comprise layers of dielectric material on a substrate, for example.

Still referring to FIG. 2, the chip 30 may include a monitoring core 60 that is operatively connected to each of the arrays 20, e.g., through wiring in the chip 30. In embodiments, the monitoring core 60 monitors the health of the sensor structures within the sensor groups within the arrays and, based on this monitoring, determines the apparent age, wear, and potential near failure of the chip 30.

According to aspects of the invention, the monitoring core 60 comprises logic (e.g., firmware) that receives signals from the arrays 20 and, based on the signals, adjusts the functional operation of one or more portions of the chip 30. For example, when the monitoring core 60 determines from one or more arrays 20 that a predetermined amount of wear has been reached, or that a partial or full failure has occurred, the monitoring core 60 may implement a "limp along" mode for the chip 30 in which the monitoring core 60 sends control signals to one or more portions of the chip 30 to dynamically tune the one or more portions, e.g., to operate at lower clock frequency and/or lower power.

According to aspects of the invention, the monitoring core 60 comprises logic (e.g., firmware) that receives signals from the arrays 20 and, based on the signals, sends a communication to an off-chip device 65 regarding the health of the chip 30. For example, when the monitoring core 60 determines from one or more arrays 20 that a predetermined amount of wear has been reached, or that a partial or full failure has occurred, the monitoring core 60 may send an alert to be displayed by a computing device that contains the chip 30. The monitoring core 60 may additionally or alternatively send an alert and/or data regarding the determined amount of wear or failure to a technical support computing device of a manufacturer of the chip 30, or any other off-chip device 65.

FIGS. 3-5 show exemplary implementations of sensor structures 11a-c of sensor group 11 of FIG. 1. According to aspects of the invention, the sensor structures 11a-c are graduated in their design such that they are expected to fail in a particular sequence (e.g., sensor structure 11a first, sensor structure 11b second, and sensor structure 11c last) due to a particular failure mechanism (e.g., thermo-mechanical stress induced voids at a material-to-material interface). In this manner, determining which of the sensors structures 11a-c have failed (partially or fully) and which have not failed provides an indication of the amount of wear the chip has experienced. Specifically, electrical continuity signals associated with the sensor structures 11a-c may be used to determine a spatial location of voids, heightened areas of stress, and thermal management issues.

In embodiments, sensor structure 11a includes a via 100a formed between and contacting two wires 105a and 110a. Sensor structure 11b includes a via 100b formed between and contacting two wires 105b and 110b. Sensor structure 11c includes a via 100c formed between and contacting two wires 105c and 110c. The vias 100a-c and wires 105a-c, 110a-c may comprise electrically conductive material (e.g., metal) and may be formed during back end of line (BEOL) processing of the chip, as described herein. For example, the vias 100a-c and wires 105a-c, 110a-c may be formed in dielectric wiring levels that are formed over transistors on a substrate of the chip. The vias and wires may be configured, for example, as part of a network of signal paths that is routed to connect the circuit elements distributed on the surface of a substrate of the chip. Within a typical network of signal paths, metal vias (e.g., studs) run substantially perpendicular to the top surface of the substrate and metal lines (e.g., wires, interconnects) run substantially parallel to the top surface of the substrate.

Still referring to FIG. 3, each sensor structure 11a-c has a respective junction 115a-c at an interface between the via and the lower wire. In this example, the material-to-material interface is a metal-to-metal interface; however, other material interfaces may be used within the scope of the invention, including but not limited to: optical conductors/pathways, carbon nanotubes, graphene sheets, and various MEMS devices and configurations. Thermal mechanical stress will affect all two-material boundaries of all geometries. Electrical field stress will vary. The geometry of the interface of the via to the lower wire defines the strength (robustness) of the junction. For example, junction 115a has a smallest area 120a (compared to areas 120b and 120c) such that junction 115a is the weakest of the sensor structures 11a-c for this particular failure mechanism (i.e., thermal and mechanical stress that induces voids in the metal at the material interface). Conversely, junction 115c has a largest area 120c (compared to areas 120a and 120c) such that junction 115c is the strongest of the sensor structures 11a-c for this particular failure mechanism. Failure of the junctions 115a-c due to this particular failure mechanism is thus designed to occur sequentially among the sensor structures 11a-c. In this example, the geometry/area is defined in part by a distance between a vertical edge of the lower wire and a vertical edge of the via, although other graduated geometries/areas may be used within the scope of the invention.

FIG. 4 shows the sensor structures 11a-c after a first amount of thermal cycling and mechanical stress has been applied to (experienced by) the chip, e.g., during actual operation of the chip. As depicted in FIG. 4, the thermal cycling and mechanical stress has caused a void 125a at the junction 115a that results in complete failure of the electrical connection between the via 100a and the lower wire 110a. However, as depicted in FIG. 4, the same amount of thermal cycling and mechanical stress would not be sufficient to cause voids at the junctions 115b and 115c.

FIG. 5 shows the sensor structures 11a-c after a second amount of thermal cycling and mechanical stress (greater than the first amount depicted in FIG. 4) has been applied to (experienced by) the chip. As depicted in FIG. 5, the thermal cycling and mechanical stress has caused a void 125b at the junction 115b that results in complete failure of the electrical connection between the via 100b and the lower wire 110b. The void 125b forms sequentially after the void 125a due to additional thermal cycling and mechanical stress being experienced by the chip. The second amount of thermal cycling and mechanical stress also causes voids 125c at the junction 115c that result in partial failure of the electrical connection between the via 100c and the lower wire 110c.

With continued reference to FIGS. 3-5, a pass/fail status of any one of the sensor structures 11a-c may be detected using an electrical continuity test between the upper and lower wires of the respective sensor structures. For example, with reference to FIG. 4, electrical continuity does not exist between upper wire 105a and lower wire 110a when a void 125a is formed in sensor structure 11a due to thermal cycling and mechanical stress. Conversely, with continued reference to FIG. 4, electrical continuity does exist between upper wire 105b and lower wire 110b in sensor structure 11b, and between upper wire 105c and lower wire 110c in sensor structure 11c. Since the sensor structures 11a-c are graduated (i.e., designed to fail in a predefined sequential order based on exposure to increasing amounts of thermal cycling and mechanical stress), determining which sensor structures 11a-c have failed (lack continuity) and which have not failed (exhibit continuity) provides an indication of a relative degree of thermal cycling and mechanical stress that has been experienced by the chip. Moreover, each of the sensor structures 11a-c may be correlated to a particular amount (value) of thermal cycling and mechanical stress that is predicted to cause failure of the sensor structure based on technology and design rules. In this manner, determining which sensor structures 11a-c have failed and which have not failed provides an indication of an apparent age of the chip based on the correlated amount of thermal cycling and mechanical stress that has been experienced by the chip.

Still referring to FIGS. 3-5, in embodiments each of the upper and lower wires of each sensor structure 11a-c may be operatively connected to the monitoring core (e.g., monitoring core 60 of FIG. 2) such that the monitoring core may continuously or periodically measure the electrical continuity between the upper and lower wires of each sensor structure 11a-c. In this manner, the monitoring core may determine when one or more of the sensor structures 11a-c has failed due to thermal cycling and mechanical stress. In embodiments, when the monitoring core determines that a predetermined one or more of the sensor structures 11a-c has failed, the monitoring core may be programmed to at least one of: adjust the performance of one or more portions of the chip, and send a message to an off-chip device regarding the detected failure. For example, based upon detecting that sensor structures 11a and 11b have both failed (e.g., as depicted in FIG. 5), the monitoring core may be configured to implement limp home mode of the chip and/or send a communication to an off-chip device.

FIGS. 6A-C, 7A-C, and 8A-C show exemplary implementations of sensor structures 12a-d of sensor group 12 of FIG. 1. According to aspects of the invention, the sensor structures 12a-d are graduated in their design such that they are expected to fail in a particular sequence due to a particular failure mechanism, e.g., thermal/mechanical/EM stress-induced metal migration between adjacent wires and vias. Wear and/or failure due to thermal/mechanical/EM stress-induced metal migration may be detected using the sensor structures 12a-d by observing electrical continuity (or lack thereof) between pairs of adjacent ones of the sensor structures 12a-d. In this manner, determining which pairs of the sensor structures 12a-d exhibit electrical continuity (and which do not) provides an indication of the amount of wear the chip has experienced.

Figure 6A:
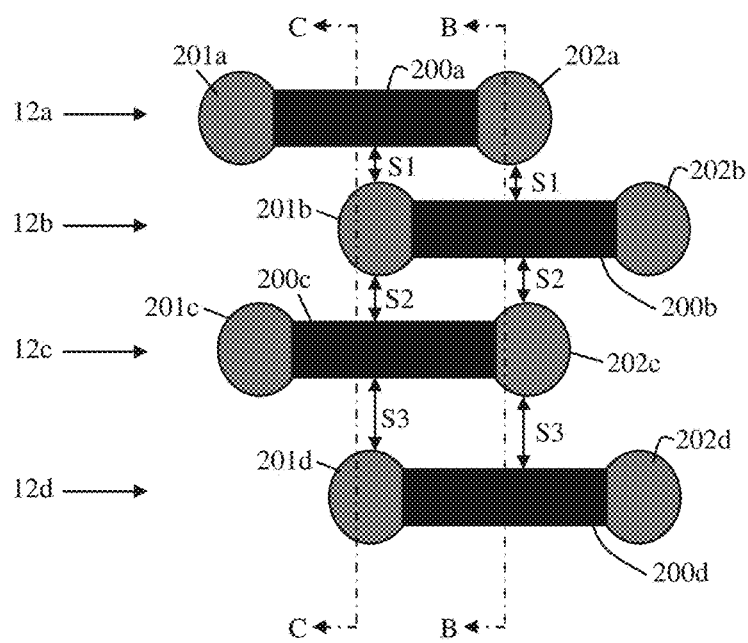
FIGS. 6A, 6B, 6C, 7A, 7B, 7C, 8A, 8B, and 8C show an implementation of another sensor structure in accordance with aspects of the invention.
Figure 6B:
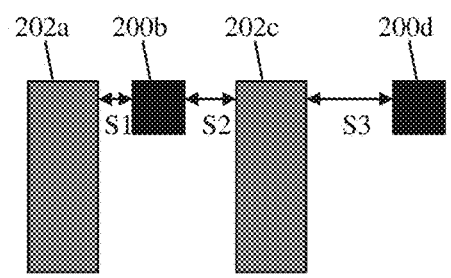
Figure 6C:
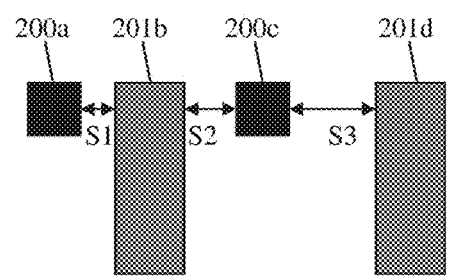

FIG. 6A shows a top (plan) view of the sensor structures 12a-d. FIG. 6B shows a side cross-section view along line B-B of FIG. 6A, and FIG. 6C shows a side cross-section view along line C-C of FIG. 6A. In embodiments, sensor structure 12a includes a wire 200a formed between and contacting two vias 201a and 202a. Sensor structure 12b includes a wire 200b formed between and contacting two vias 201b and 202b. Sensor structure 12c includes a wire 200c formed between and contacting two vias 201c and 202c. Sensor structure 12d includes a wire 200d formed between and contacting two vias 201d and 202d. The vias and wires may be formed during back end of line (BEOL) processing of the chip, as described herein. For example, the vias and wires may be formed in dielectric material that is arranged over transistors on a substrate of the chip.

Still referring to FIGS. 6A-C, the sensor structures 12a-d are spatially located relative to one another such that there is a first spacing S1 between sensor structure 12a and sensor structure 12b, a second spacing S2 between sensor structure 12b and sensor structure 12c, and a third spacing S3 between sensor structure 12c and sensor structure 12d. The geometry of the spacing between a pair of the sensor structures defines a relative strength of the pair of the sensor structures for this particular failure mechanism (i.e., thermal/mechanical/EM stress that induces metal migration into the surrounding dielectric material). For example, the pair of sensor structures 12a and 12b has the smallest spacing S1 (compared to spacing S2 and S3), such that this is the weakest sensor structure pair for this particular failure mechanism. Conversely, the pair of sensor structures 12c and 12d has the largest spacing S3 (compared to spacing S1 and S2), such that this is the strongest sensor structure pair for this particular failure mechanism.

Figure 7A:
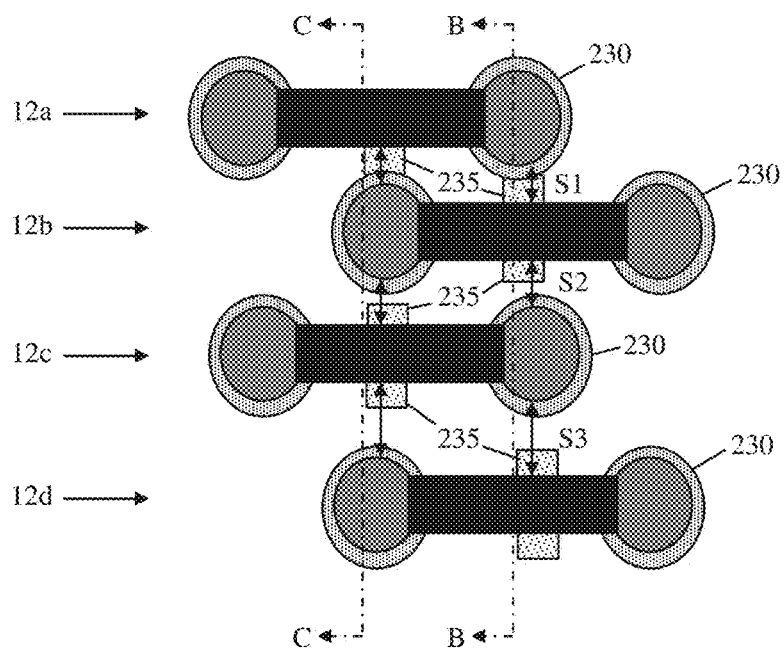
Figure 7B:
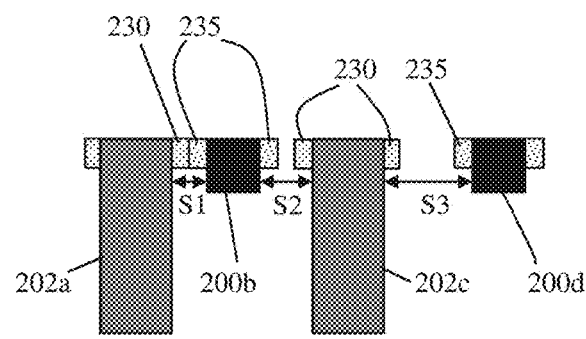
Figure 7C:
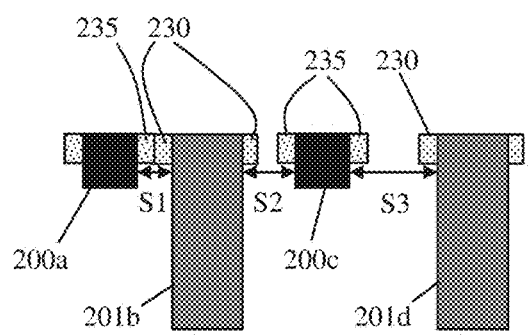

FIGS. 7A-C show the sensor structures 12a-d after a first amount of thermal/mechanical/EM stress has been applied to (experienced by) the chip during actual operation of the chip. As depicted in FIGS. 7A-C, the thermal/mechanical/ EM stress has caused metal to migrate out of the vias and/or wires and into the surrounding dielectric material as indicated at reference numbers 230 and 235. The extent of metal migration 230, 235 due to the first amount of thermal/ mechanical/EM stress is equal to or greater than the first spacing S1, such that an electrical short (conductive path) is created between sensor structure 12a and sensor structure 12b, e.g., as depicted at elements 202a, 200b, 200a, 201b. However, the same extent of metal migration 230, 235 due to the first amount of thermal/mechanical/EM stress is less than the second spacing S2 and the third spacing S3, such that sensor structure 12b remains electrically isolated from sensor structure 12c and sensor structure 12c remains electrically isolated from sensor structure 12d, e.g., as depicted at elements 200b, 202c, 200d, 201b, 200c, 201d.

Figure 8A:
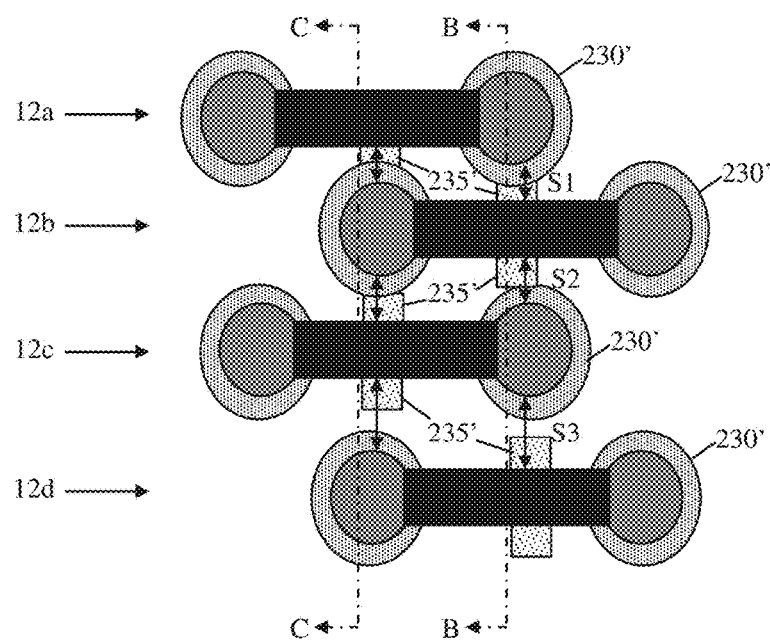
Figure 8B:
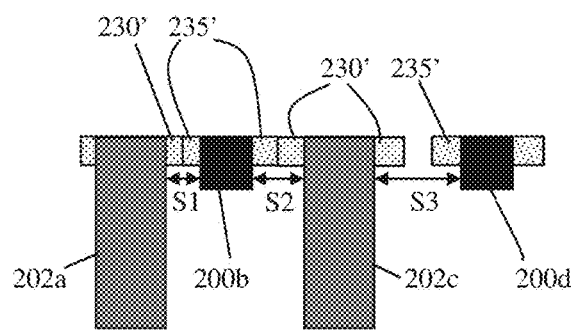
Figure 8C:
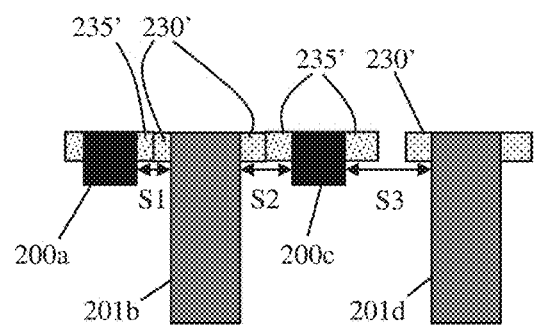

FIGS. 8A-C show the sensor structures 12a-d after a second amount of thermal/mechanical/EM stress has been applied to (experienced by) the chip during actual operation of the chip. The second amount of thermal/mechanical/EM stress is greater than the first amount of thermal/mechanical/ EM stress described with respect to FIGS. 7A-C. As depicted in FIGS. 8A-C, the thermal/mechanical/EM stress has caused metal to migrate even further out of the vias and/or wires and into the surrounding dielectric material as indicated at reference numbers 230' and 235'. The extent of metal migration 230' and 235' due to the second amount of thermal/mechanical/EM stress is equal to or greater than the second spacing S2, such that an electrical short (conductive path) is created between sensor structure 12b and sensor structure 12c, e.g., as depicted at elements 202a, 200b, 200a, 201b. However, the same extent of metal migration 230' and 235' due to the second amount of thermal/mechanical/EM stress is less than the third spacing S3, such that sensor structure 12c remains electrically isolated from sensor structure 12d, e.g., as depicted at elements 202c, 200d, 200c, 201d.

With continued reference to FIGS. 6A-8C, a pass/fail status of any one of the pairs of the sensor structures 12a-d may be detected using an electrical continuity test between the respective sensor structures includes in a particular pair. For example, with reference to FIGS. 7A-C, electrical continuity exists between sensor structures 12a and 12b, which indicates that there is a failure at this pair. Conversely, with continued reference to FIGS. 7A-C, electrical continuity does not exist between sensor structures 12b and 12c or between sensor structures 12c and 12d, which indicates that there is not a failure at either of these pairs. Since the sensor structures 12a-d are graduated in their respective spacing S1, S2, S3, determining which of the pairs have failed (exhibit continuity) and which have not failed (lack continuity) provides an indication of a relative degree of the thermal/ mechanical/EM stress that has been experienced by the chip. Moreover, each spacing S1, S2, S3 may be correlated to a particular amount (value) of thermal/mechanical/EM stress that is predicted to cause failure of the sensor structure based on technology and design rules. In this manner, determining which pairs of sensor structures 12a-d have failed and which have not failed provides an indication of an apparent age of the chip based on the correlated amount of thermal/mechanical/EM stress that has been experienced by the chip.

Still referring to FIGS. 6A-8C, in embodiments each of the sensor structures 12a-d may be operatively connected to the monitoring core (e.g., monitoring core 60 of FIG. 2) such that the monitoring core may continuously or periodically measure the electrical continuity between sensor pairs (e.g., pair 12a/12b, pair 12b/12c, and pair 12c/12d). In this manner, the monitoring core may determine when one or more of the sensor structure pairs have failed due to thermal/ mechanical/EM stress-induced metal migration. In embodiments, when the monitoring core determines that a predetermined one or more of the sensor structure pairs has failed, the monitoring core may be programmed to at least one of: adjust the performance of one or more portions of the chip, and send a message to an off-chip device regarding the detected failure. For example, based upon detecting that sensor structure pairs 12a/12b and 12b/12c have both failed (e.g., as depicted in FIGS. 8A-C), the monitoring core may be configured to implement limp home mode of the chip and/or send a communication to an off-chip device.

FIGS. 9A-C and 10A-C show exemplary implementations of sensor structures 13a-d of sensor group 13 of FIG. 1. According to aspects of the invention, the sensor structures 13a-d are graduated in their design such that they are expected to fail in a particular sequence due to a particular failure mechanism, e.g., thermal/mechanical/EM stress-induced dielectric breakdown between adjacent wires and vias. In embodiments, wear and/or failure due to thermal/mechanical/EM stress-induced dielectric breakdown may be detected using the sensor structures 13a-d by observing an amount of resistance and/or capacitance between pairs of adjacent ones of the sensor structures 13a-d. In this manner, determining which pairs of the sensors structures 13a-d exhibit a threshold amount of resistance and/or capacitance provides an indication of the amount of wear the chip has experienced.

Figure 9A:
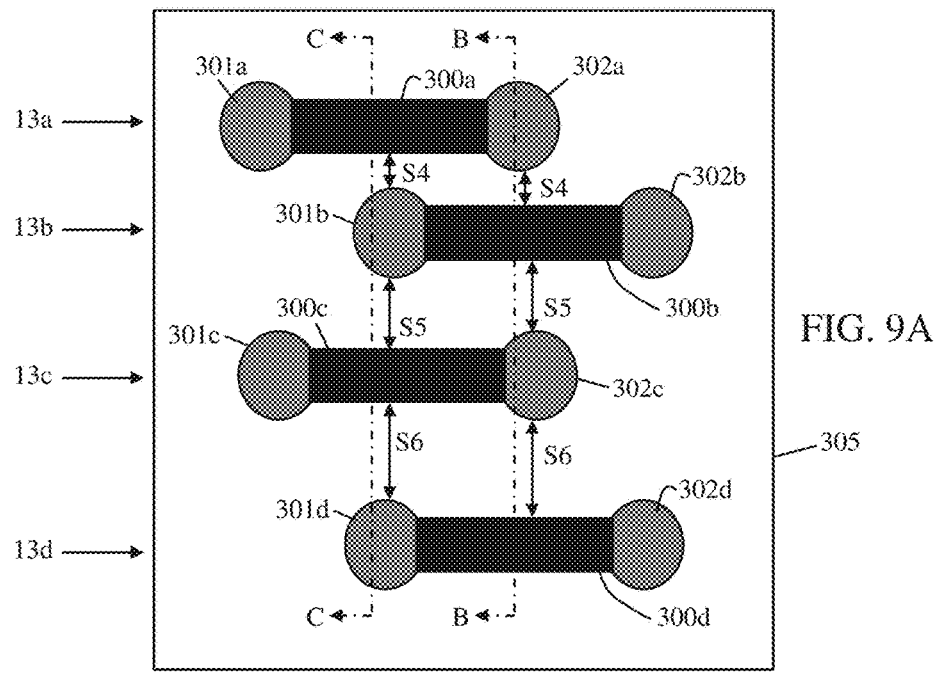
FIGS. 9A, 9B, 9C, 10A, 10B, and 10C show an implementation of another sensor structure in accordance with aspects of the invention.
Figure 9B:
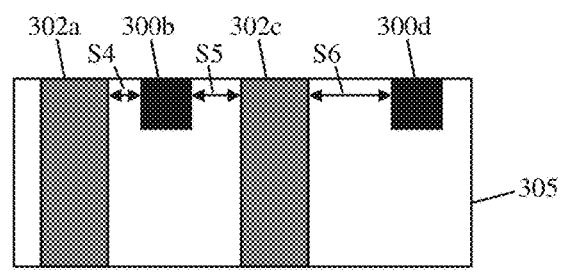
Figure 9C:
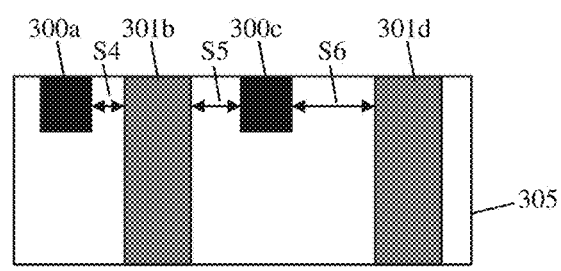

FIG. 9A shows a top (plan) view of the sensor structures 13a-d. FIG. 9B shows a side cross-section view along line B-B of FIG. 9A, and FIG. 9C shows a side cross-section view along line C-C of FIG. 9A. In embodiments, sensor structure 13a includes a wire 300a formed between and contacting two vias 301a and 302a. Sensor structure 13b includes a wire 300b formed between and contacting two vias 301b and 302b. Sensor structure 13c includes a wire 300c formed between and contacting two vias 301c and 302c. Sensor structure 13d includes a wire 300d formed between and contacting two vias 301d and 302d. The vias and wires may be formed during back end of line (BEOL) processing of the chip, as described herein. For example, the vias and wires may be formed in dielectric material that is arranged over transistors on a substrate of the chip.

Still referring to FIGS. 9A-C, the sensor structures 13a-d are spatially located relative to one another such that there is a first spacing S4 between sensor structure 13a and sensor structure 13b, a second spacing S5 between sensor structure 13b and sensor structure 13c, and a third spacing S6 between sensor structure 13c and sensor structure 13d. The geometry of the spacing between a pair of the sensor structures is graduated and defines a relative strength of the pair of the sensor structures for this particular failure mechanism (i.e., thermal/mechanical/EM stress that induces breakdown of the dielectric material 305 between the wires and vias). For example, the pair of sensor structures 13a and 13b has the smallest spacing S4 (compared to spacing S5 and S5), such that this is the weakest sensor structure pair for this particular failure mechanism. Conversely, the pair of sensor structures 13c and 13d has the largest spacing S6 (compared to spacing S4 and S5), such that this is the strongest sensor structure pair for this particular failure mechanism.

Figure 10A:
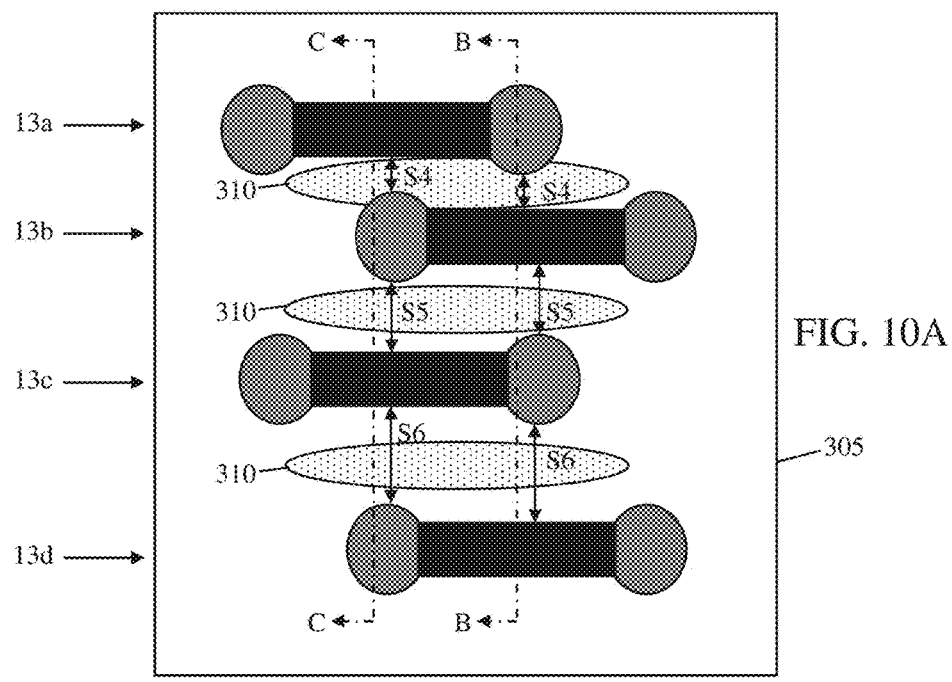
Figure 10B:
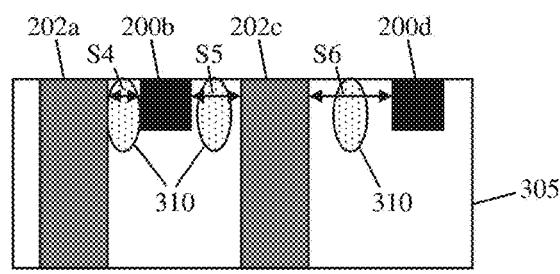
Figure 10C:
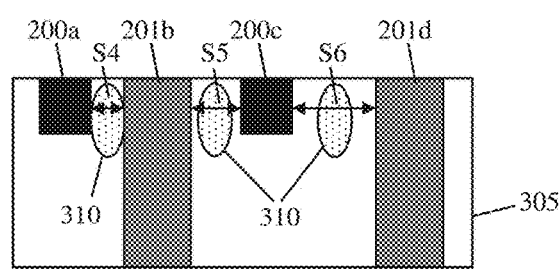

FIGS. 10A-C show the sensor structures 13a-d after a first amount of thermal/mechanical/EM stress has been applied to (experienced by) the chip during actual operation of the chip. As depicted in FIGS. 10A-C, the thermal/mechanical/EM stress has caused breakdown of the surrounding dielectric material 305 at regions 310. The breakdown regions 310 affect the insulating capacity of the dielectric material 305, such that the generation of the breakdown regions 310 changes the resistance between pairs of adjacent ones of the sensor structures 13a-d. Moreover, the resistance between any two adjacent sensor structures is based on a ratio of the size of the breakdown region 310 to the total amount of dielectric material 305 between the two adjacent sensor structures as defined by the respective amounts of spacing S4, S5, S6. Accordingly, since the spacing S4 is smaller than the spacing S5, the breakdown region 310 causes the resistance between sensor structures 13a and 13b to be less than the resistance between sensor structures 13a and 13b. Similarly, since the spacing S5 is smaller than the spacing S6, the breakdown region 310 causes the resistance between sensor structures 13b and 13c to be less than the resistance between sensor structures 13c and 13d.

With continued reference to FIGS. 9A-10C, a pass/fail status of any one of the pairs of the sensor structures 13a-d may be detected measuring the electrical resistance between the respective sensor structures included in a particular pair. For example, before any breakdown regions 310 form, the resistance between the respective sensor structures for each pair is effectively infinite. As the breakdown regions 310 expand, the measured resistance for each of the respective sensor structures decreases. A fail state may be deemed to exist for any particular pair of sensor structures when the measured resistance for the particular pair of sensor structures decreases below a predetermined threshold value. Since the sensor structures 13a-d are graduated in their respective spacing S4, S5, S6, determining which of the pairs have failed (exhibit resistance below the threshold value) and which have not failed (exhibit resistance above the threshold value) provides an indication of a relative degree of the thermal/mechanical/EM stress that has been experienced by the chip. Moreover, each spacing S4, S5, S6 may be correlated to a particular amount of thermal/mechanical/EM stress that is predicted to cause failure of the sensor structure based on technology and design rules. In this manner, determining which pairs of sensor structures 13a-d have failed and which have not failed provides an indication of an apparent age of the chip based on the correlated amount of thermal/mechanical/EM stress that has been experienced by the chip.

Still referring to FIGS. 9A-10C, in embodiments, each of the sensor structures 13a-d may be operatively connected to the monitoring core (e.g., monitoring core 60 of FIG. 2) such that the monitoring core may continuously or periodically measure the electrical resistance between sensor pairs (e.g., pair 13a/13b, pair 13b/13c, and pair 13c/13d). In this manner, the monitoring core may determine when one or more of the sensor structure pairs have failed due to thermal/mechanical/EM stress-induced dielectric breakdown. In embodiments, when the monitoring core determines that a predetermined one or more of the sensor structure pairs has failed, the monitoring core may be programmed to at least one of: adjust the performance of one or more portions of the chip, and send a message to an off-chip device regarding the detected failure. For example, based upon detecting that sensor structure pairs 13a/13b and 13b/13c have both failed, the monitoring core may be configured to implement limp home mode of the chip and/or send a communication to an off-chip device.

Figure 11:
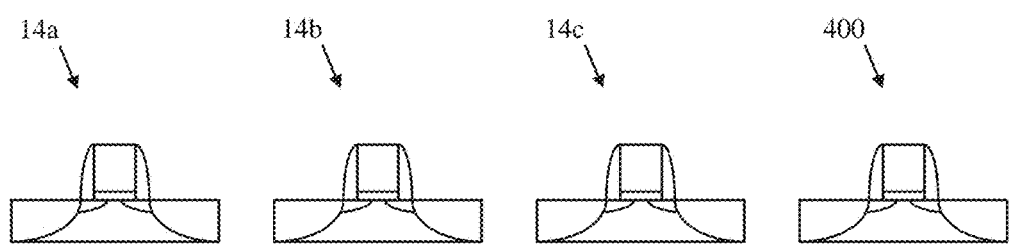
FIG. 11 shows an implementation of another sensor structure in accordance with aspects of the invention.

FIG. 11 shows exemplary implementations of sensor structures 14a-c of sensor group 14 of FIG. 1. According to aspects of the invention, the sensor structures 14a-c are stressed transistors that are substantially identical to one or more operational (non-sensor) transistors 400 on the chip, but that are operated at an elevated level of a parameter (e.g., voltage, temperature, frequency, etc.) that is higher than the nominal operational level of the parameter for the operational transistors 400 on the chip. In this manner, the stressed transistors may be used to measure accelerated aging or wear of the operational transistors 400 due to specific sub-modes of transistor failure, such as bias temperature instability (BTI), hot-carrier injection, etc. The stressed transistors may be formed using conventional CMOS processes as described herein.

In embodiments, the stressed transistors are graduated relative to one another. For example, the stressed transistor of sensor structure 14a may be operated at a first elevated level of a parameter (e.g., voltage), the stressed transistor of sensor structure 14b may be operated at a second elevated level of a parameter that is greater than the first elevated level, and the stressed transistor of sensor structure 14c may be operated at a third elevated level of a parameter that is greater than the second elevated level.

In embodiments, the monitoring core (e.g., monitoring core 60) is operatively connected to the sensor structures 14a-c and is configured to detect when one or more of the sensor structures 14a-c experiences wear or failure. For example, the monitoring core may be configured to detect the threshold voltage of each of the stressed transistors of the sensor structures 14a-c to determine whether the threshold voltage has permanently increased due to BTI. The monitoring core may be configured to detect a time it takes a stressed transistor to fail due to BTI when the stressed transistor is operating at the elevated value of a parameter (e.g., voltage, temperature, frequency, etc.), and to correlate this time to an expected life of the operational transistor 400 operating at the nominal value of a parameter. When the actual (chronological) age of the operational transistor 400 operating at the nominal value of a parameter approaches or exceeds the determined expected life, the monitoring core may be configured to at least one of: adjust the performance of one or more portions of the chip, and send a message to an off-chip device regarding the detected failure.

As described herein, implementations of the invention may include a sensor structure or an array of sensor structures for gauging effects of circuit failure from breakdown or defect mechanisms including but not limited to metal migration, dielectric breakdown, thermal-mechanical stress, and transistor failure (with specific sub-modes). The sensor structures may include passive components, active components that run at device specifications, and/or stressed components that run beyond nominal operating voltage, temperature, and/or frequency of the product.

In embodiments, a system may include arrays of the same sensor structure that are graduated based on design rules, knowledge of breakdown mechanisms, and physics. The graduation between/among the sensor structures may be based on: log/linear spacing arrays of critical dimensions of the sensor structure devices or in-between the sensor structure devices; varying width/height/depth of the sensor structure devices; or quantized chemical/dopant gradient across the sensor structure devices. There may be multiple instantiations of arrays for comparative/statistical analysis and inherent manufacturing variability and/or for wear analysis and apparent aging of any grouping of on-die logic (including but not limited to IP-blocks).

In embodiments, the system includes a monitoring core that actively monitors the sensor structures for reliability and/or in anticipation of immanent failure. The monitoring core may be configured to send a communication to an off-chip device based on the monitoring of the sensor structures, e.g., to report a failure, schedule maintenance, etc. The monitoring core may be configured to, based on the monitoring of the sensor structures, modify the performance (e.g., frequency, voltage, latency, timing, etc.) of parts of the chip such that the chip can maintain degraded functionality as opposed to complete failure. There may be an encasing structure, liner or isolating mechanism that encases the monitoring core and/or the sensor structures to prevent the monitoring core and/or the sensor structures from interfering with the operation of other circuits on the chip. The encasing structure, liner or isolating mechanism may comprise, for example, a floating ground, hardwire to the ground pin, RF/faraday cage, and electrostatic discharge protection.

In embodiments, there is an interface method for post-circuit-failure analysis (in the event of monitor core or other failure), including, but not limited to visual/hyper-spectral inspection, passive radio frequency (RF), electrical, physical/destructive analysis. There may also be an interface that allows for powering the monitoring core and/or the sensor structures independent of chip power net. For example, the monitoring core and/or the sensor structures may be powered by RF separate from other circuits on the chip. Another example of an interface that may be used with aspects herein includes a clear glass/plastic window in the die package to allow visual/hyper-spectral inspection of back-end-of-line sensor structures, or dedicated pins/pads on the die/package to allow communication/power with the monitor core (I2C being one potential "two-wire" bus to achieve communication).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An on-chip sensor system, comprising:
an integrated circuit chip comprising a plurality of sensor groups located on respective functional blocks of the integrated circuit chip, wherein output of the sensor groups correlates to actual wear of the integrated circuit chip based on an actual operational environment of the integrated circuit chip, the plurality of sensor groups including:
   a first sensor group on a first functional block of the integrated circuit chip comprising first sensor structures that are configured to detect a measure of different amounts of wear based on a first failure mechanism; and
   a second sensor group on a second functional block of the integrated circuit chip comprising second sensor structures that are configured to detect a measure of different amounts of wear based on a second failure mechanism different from the first failure mechanism.

2. The system of claim 1, wherein each of the plurality of sensor groups are arranged in an array.

3. The system of claim 1, wherein each of the first and second failure mechanisms comprise one of the group consisting of:
stress induced voids at a material-to-material interface;
stress induced shorting due to metal migration;
dielectric material breakdown; and
transistor failure.

4. The system of claim 1, further comprising a monitoring core on the chip and operatively connected to each one of the plurality of sensor groups.

5. The system of claim 4, wherein the monitoring core is configured to dynamically adjust operation of the chip based on a detected state of at least one of the plurality of sensor groups.

6. The system of claim 4, wherein the monitoring core is configured to send a communication to an off-chip device based on a detected state of at least one of the plurality of sensor groups.

7. The system of claim 1, wherein each of the first sensor structures comprises a metal via extending vertically between an upper metal wire and a lower metal wire.

8. The system of claim 1, wherein:
a first one of the first sensor structures is structured and arranged to develop a void at an interface between a first via and a first wire based on a first level of exposure to the first failure mechanism;
a second one of the first sensor structures is structured and arranged to develop a void at an interface between a second via and a second wire based on a second level of exposure to the first failure mechanism; and
a third one of the first sensor structures is structured and arranged to develop a void at an interface between a third via and a third wire based on a third level of exposure to the first failure mechanism;
wherein the first level of exposure, the second level of exposure, and the third level of exposure are all different from one another.

9. The system of claim 1, wherein each of the second sensor structures comprises a metal wire extending horizontally between two metal vias.

10. The system of claim 1, wherein:
a first pair of the second sensor structures is structured and arranged to develop an electrical short based on a first level of exposure to the second failure mechanism;
a second pair of the second sensor structures is structured and arranged to develop an electrical short based on a second level of exposure to the second failure mechanism; and
a third pair of the second sensor structures is structured and arranged to develop an electrical short based on a third level of exposure to the second failure mechanism;
wherein the first level of exposure, the second level of exposure, and the third level of exposure are all different from one another.

11. The system of claim 1, wherein:
there is a first spacing between a first one of the second sensor structures and a second one of the second sensor structures;
there is a second spacing between the second one of the second sensor structures and a third one of the second sensor structures;
there is a third spacing between the third one of the second sensor structures and a fourth one of the second sensor structures;
the second spacing is greater than the first spacing; and
the third spacing is greater than the second spacing.

12. The system of claim 1, wherein:
the plurality of sensor groups further comprises a third sensor group comprising third sensor structures that are configured to indicate different amounts of wear based on a third failure mechanism, and a fourth sensor group comprising fourth sensor structures that are configured to indicate different amounts of wear based on a fourth failure mechanism; and wherein:
the first sensor group comprises thermo-mechanical stress sensors and the first failure mechanism comprises stress induced voids at a material-to-material interface;
the second sensor group comprises thermo-mechanical stress sensors and the second failure mechanism comprises stress induced shorting due to metal migration;
the third sensor group comprises thermo-mechanical stress and electromigration sensors, and the third failure mechanism comprises dielectric material breakdown; and
the fourth sensor group comprises transistor failure sensors and the fourth failure mechanism comprises accelerated transistor aging.

13. The system of claim 1, wherein:
the chip additionally comprises an operational transistor that is separate from the plurality of sensor groups; and
one of the plurality of sensor groups comprises a stressed transistor that is operated at least one of a higher voltage, a higher temperature, and a higher frequency than the operational transistor.

14. The system of claim 1, wherein the functional blocks are selected from the group consisting of: a processor core, a cache, an input/output block, a power region, and a nest.

15. A semiconductor device, comprising:
a first group of graduated sensor structures that are configured to fail sequentially at different levels of exposure to a first failure mechanism, the first group of graduated sensor structures on a first location in a die portion of an integrated circuit chip,
a second group of graduated sensor structures that are configured to fail sequentially at different levels of exposure to the first failure mechanism, the second group of graduated sensor structures on a second location in the die portion of the integrated circuit chip,
a third group of graduated sensor structures that are configured to fail sequentially at different levels of exposure to a second failure mechanism different from the first failure mechanism, the third group of graduated sensor structures on a third location in the die portion of the integrated circuit chip; and
a fourth group of graduated sensor structures that are configured to fail sequentially at different levels of exposure to the second failure mechanism, the fourth group of graduated sensor structures on a fourth location in the die portion of the integrated circuit chip,
wherein output of the first sensor group, the second sensor group, the third sensor group and the fourth sensor group correlates to an amount of actual wear the integrated circuit chip has experienced based on an actual operational environment of the integrated circuit chip.

16. The device of claim 15, wherein:
the first group of graduated sensor structures comprises:
- a first via between and contacting a first upper wire and a first lower wire, with a first junction at a first material-to-material interface between the first via and the first lower wire, the first junction having a first area defined by a distance between a vertical edge of the first lower wire and a vertical edge of the first via; and
- a second via between and contacting a second upper wire and a second lower wire, with a second junction at a second material-to-material interface between the second via and the second lower wire, the second junction having a second area defined by a distance between a vertical edge of the second lower wire and a vertical edge of the second via;

the first failure mechanism comprises thermo-mechanical stress induced voids at a material-to-material interface; and the first junction and the second junction fail at different levels of exposure to the first failure mechanism based on the first area of the first junction being different than the second area of the second junction.

17. The device of claim 16, further comprising a monitoring core on the chip, wherein the monitoring core is configured to perform at least one of:
- dynamically adjust operation of the chip based on a detected state of at least one of the first group of graduated sensor structures and the second group of graduated sensor structures; and
- send a communication to an off-chip device based on the detected state of at least one of the first group of graduated sensor structures and the second group of graduated sensor structures.

18. A method of determining an amount of wear on a semiconductor device, comprising:
- detecting failure of a first sensor structure in a group of graduated sensor structures that are structured and arranged to fail sequentially due to exposure to a first failure mechanism, wherein the sensor structures are formed on a first functional block in the semiconductor device;
- correlating the failure of the first sensor structure to an amount of actual wear experienced by the semiconductor device based on the first failure mechanism of an actual operational environment of the integrated circuit chip;
- detecting failure of a second sensor structure in a group of graduated sensor structures that are structured and arranged to fail sequentially due to exposure to a second failure mechanism, wherein the sensor structures are formed on a second functional block in the semiconductor device; and
- correlating the failure of the second sensor structure to an amount of actual wear experienced by the semiconductor device based on the second failure mechanism of the actual operational environment of the integrated circuit chip.

19. The method of claim 18, further comprising adjusting performance of a component of the semiconductor device based on the detecting, wherein the detecting and the adjusting are performed by a monitor core incorporated in the semiconductor device.

20. The method of claim 18, further comprising sending a message to a device that is external to the semiconductor device, wherein the detecting and the sending are performed by a monitor core incorporated in the semiconductor device, and the sending is based on the detecting.

* * * * *